United States Patent
Baek et al.

(10) Patent No.: US 8,921,208 B1
(45) Date of Patent: Dec. 30, 2014

(54) METHOD FOR FABRICATING SEMICONDUCTOR DEVICE

(71) Applicant: SK Hynix Inc., Gyeonggi-do (KR)

(72) Inventors: Seung Beom Baek, Gyeonggi-do (KR);
Bo Min Park, Gyeonggi-do (KR);
Young Ho Lee, Gyeonggi-do (KR);
Jong Chul Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/157,226

(22) Filed: Jan. 16, 2014

(30) Foreign Application Priority Data

Sep. 27, 2013 (KR) .................. 10-2013-0115013

(51) Int. Cl.
*H01L 21/20* (2006.01)
*H01L 21/762* (2006.01)
*H01L 21/02* (2006.01)

(52) U.S. Cl.
CPC ...... *H01L 21/7624* (2013.01); *H01L 21/02271* (2013.01); *H01L 21/0206* (2013.01)
USPC .......................................................... 438/479

(58) Field of Classification Search
USPC .................................................. 438/478–509
See application file for complete search history.

(56) References Cited

U.S. PATENT DOCUMENTS

| | | | | |
|---|---|---|---|---|
| 6,025,279 | A * | 2/2000 | Chiang et al. | 438/760 |
| 6,229,172 | B1 * | 5/2001 | Kobayashi | 257/298 |
| 7,364,997 | B2 * | 4/2008 | Juengling | 438/584 |
| 2005/0266650 | A1 * | 12/2005 | Ahn et al. | 438/381 |

FOREIGN PATENT DOCUMENTS

| | | |
|---|---|---|
| KR | 1019980030446 | 7/1998 |
| KR | 1020130104527 | 9/2013 |

\* cited by examiner

*Primary Examiner* — Karen Kusumakar
(74) *Attorney, Agent, or Firm* — IP & T Group LLP

(57) ABSTRACT

A method for fabricating a semiconductor device includes forming a first insulating layer in a first area of the semiconductor substrate, lowering a height of the semiconductor substrate in a second area and a height of the first insulating layer in the first area, selectively forming a sacrificial layer in the second area using the first insulating layer as a growth prevention layer, and forming a first semiconductor layer on the semiconductor substrate including the sacrificial layer.

10 Claims, 3 Drawing Sheets

METHOD FOR FABRICATING SEMICONDUCTOR DEVICE

CROSS-REFERENCES TO RELATED APPLICATION

This application claims priority under 35 U.S.C. 119(a) to Korean application No. 10-2013-0115013, filed on Sep. 27, 2013, in the Korean intellectual property Office, which is incorporated by reference in its entirety as set forth in full.

BACKGROUND

1. Technical Field

Various exemplary embodiments of the inventive concept relate to a method for fabricating a semiconductor device, and more particularly, to a method for fabricating a semiconductor device including a silicon-on-insulator (SOI) substrate.

2. Related Art

In general, semiconductor devices includes a cell area in which memory cells are formed, and a peripheral area (a peri area) in which peripheral circuits for driving the memory cells are formed. While the memory cells are highly integrated in the cell area, the peripheral circuits are formed with a relatively large pitch in the peripheral area as compared with the memory cells in the cell area. Thus, the cell area has a height higher than the peripheral area after the process is completed.

In particular, semiconductor devices including an SOI substrate are fabricated using a process of sequentially forming a sacrificial layer and a first semiconductor layer on a semiconductor substrate through an epitaxial method.

However, in order to form the sacrificial layer in the certain region, the sacrificial layer is formed in the entire region and removed from the other region, for example, in the peripheral area. Therefore, there may be a step difference between the regions.

SUMMARY

One or more exemplary embodiments of the present invention are provided to a method for fabricating a semiconductor device capable of reducing a step difference between a cell area and a peripheral area of the semiconductor device.

According to an embodiment of the present invention, there is provided a method for fabricating a semiconductor device. The method may include forming a first insulating layer in a first area of the semiconductor substrate, lowering a height of the semiconductor substrate in a second area and a height of the first insulating layer in the first area, selectively forming a sacrificial layer in the second area using the first insulating layer as a growth prevention layer, and forming a first semiconductor layer on the semiconductor substrate including the sacrificial layer.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
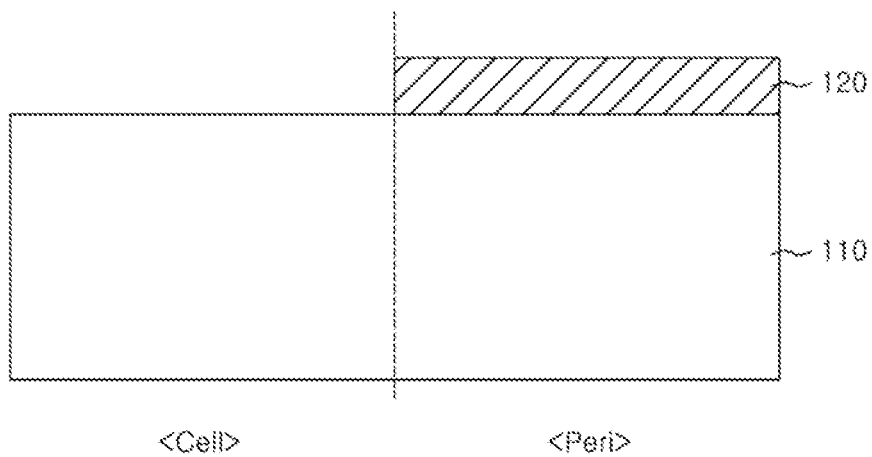
FIGS. 1 to 6 are cross-sectional views illustrating a method for fabricating a semiconductor device according to an embodiment of the inventive concept.
Figure 2:
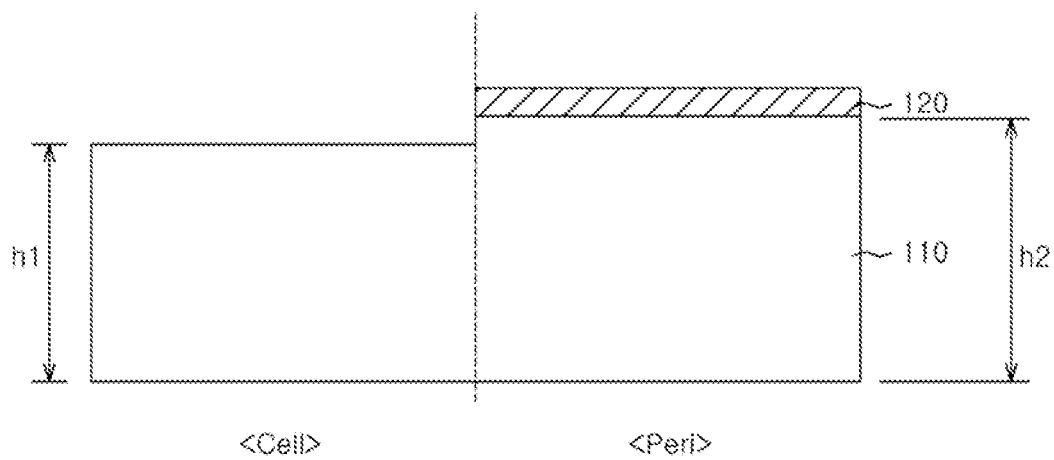

Hereinafter, exemplary embodiments of the present invention will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

Although a few embodiments of the inventive concept will be shown and described, it will be appreciated by those of ordinary skill in the art that changes may be made in these exemplary embodiments without departing from the principles and spirit of the inventive concept.

Hereinafter, a method for fabricating a semiconductor device according to an embodiment of the inventive concept will be described with reference to FIGS. 1 to 6.

Referring to FIG. 1, an insulating layer 120 is formed only on a peripheral area of a semiconductor substrate 110 including a cell area and the peripheral area. The insulating layer 120 may be formed using an oxide layer or a nitride layer. Preferably, the insulating layer 120 may be the oxide layer.

A common source region (not shown) of a predetermined depth may be formed in an upper surface of the semiconductor substrate 110. The common source region may be formed by implanting for example, N type impurities. Alternatively, the common source region may be formed after an active region to be described later is defined.

The insulating layer 120 in the peripheral area of the semiconductor substrate 110 may be formed by forming an insulating layer on an entire surface of the semiconductor substrate 110, and removing a portion of the insulating layer from the cell area through a cell open mask (not shown).

Alternatively, the insulating layer 120 in the peripheral area may be formed by depositing the insulating layer 120 only on the peripheral area through a peripheral open mask (not shown).

Next, at least one process of a pre-cleaning process and a pre-baking process is performed on the semiconductor substrate including the insulating layer 120.

The pre-cleaning process may be performed through a wet method or a dry method. Alternatively, the pre-cleaning process may be performed through a wet method and a dry method in-situ. A native oxide and other particles of an exposed surface of the semiconductor substrate 110, that is, a surface of the cell area, may be, removed through the cleaning process.

The pre-baking process is a process of performing a baking treatment at a high temperature for a certain period of time. Like the pre-cleaning, the pre-baking process may remove a native oxide and other particles of the surface of the cell area.

When the cleaning process and the baking process are performed as described above, as illustrated in FIG. 2, silicon (Si) of the surface of the cell area may be etched, and thus the height of the semiconductor substrate in the cell area may be reduced. Similarly, the insulating layer 120 in the peripheral area may be slightly removed, and the thickness of the insulating layer 120 in the peripheral area may be reduced.

Therefore, in the embodiment, since a height h1 of the semiconductor substrate 110 in the cell area is shorter than a height h2 of the semiconductor substrate 110 in the peripheral area, a step difference between the cell area and the peripheral area may be reduced as compared in the related art even when a sacrificial layer (see 130 of FIG. 3) is formed in a subsequent process.

Figure 3:
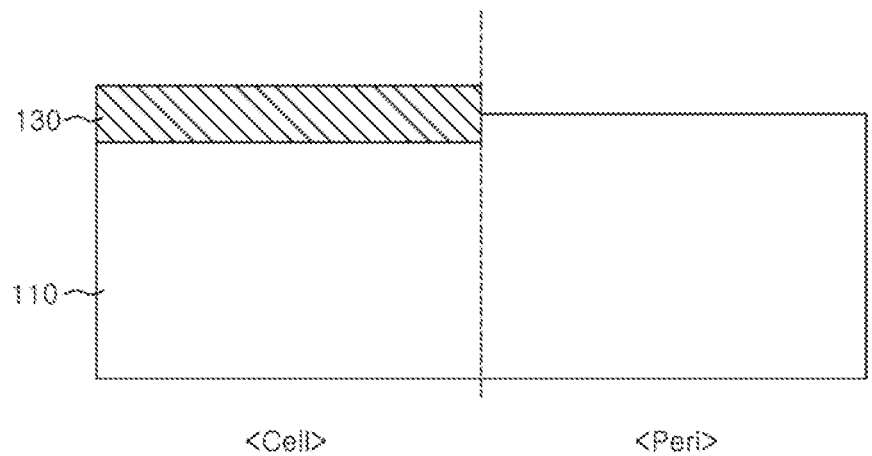

As illustrated in FIG. 3, the sacrificial layer 130 is selectively formed on the cell area of the semiconductor substrate 110. The sacrificial layer 130 may include silicon germanium (SiGe), and may be grown to have a perfect crystalline state through an epitaxial method.

Specifically, $GeH_4/SiH_4$ as a deposition gas is provided onto the semiconductor substrate 110.

A silicon (Si) component of the semiconductor substrate 110 and a germanium (Ge) component of the deposition gas are continuously combined in the cell area of the semiconductor substrate 110, so that the SiGe layer having a certain thickness is grown through an epitaxial method.

An oxygen (O) component of the insulating layer 120 and the Ge component of the deposition gas are combined in the peripheral area of the semiconductor substrate 110 so that GeO gas is formed and vaporized. Therefore, the thickness of the insulating layer 120 in the peripheral area may be increasingly reduced due to the continuous formation of the GeO gas, and then the insulating layer 120 may be completely removed as illustrated in FIG. 3.

The insulating layer 120 may be formed to have a thickness so that the insulating layer 120 remains to have a predetermined thickness after the pre-cleaning process and the pre-baking process, and the remaining insulating layer 120 is completely removed while the SiGe layer having a certain thickness is formed in the cell area.

In the embodiment, in the process of growing the sacrificial layer (the SiGe layer) 130 in the cell area through an epitaxial method as described above, $GeH_4/SiH_4$ as a deposition gas may be provided and the insulating layer 120 is removed without an etch gas such as Cl gas. Therefore, defects caused due to the Cl gas may be prevented from being induced in the growth of the SiGe layer.

Figure 4:
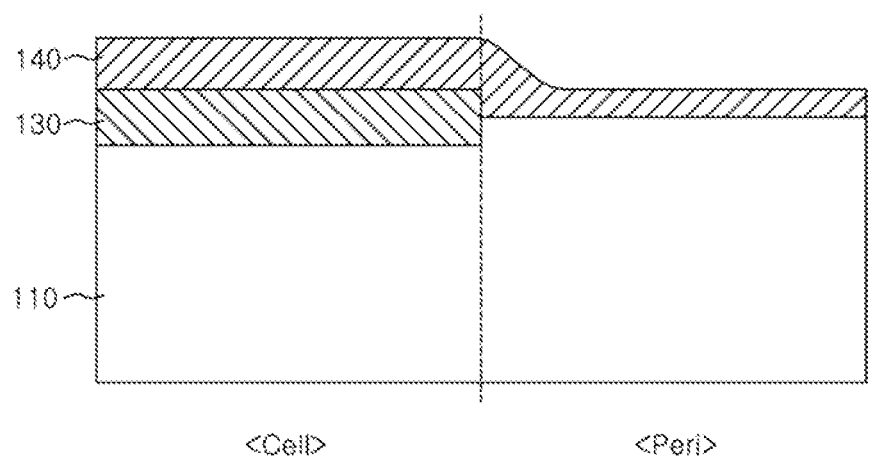

As illustrated in FIG. 4, a first semiconductor layer 140 is formed on the semiconductor substrate from which the insulating layer 120 is removed. The first semiconductor layer 140 may be a silicon (Si) layer and may be formed to have a perfect crystalline state through an epitaxial method.

Figure 5:
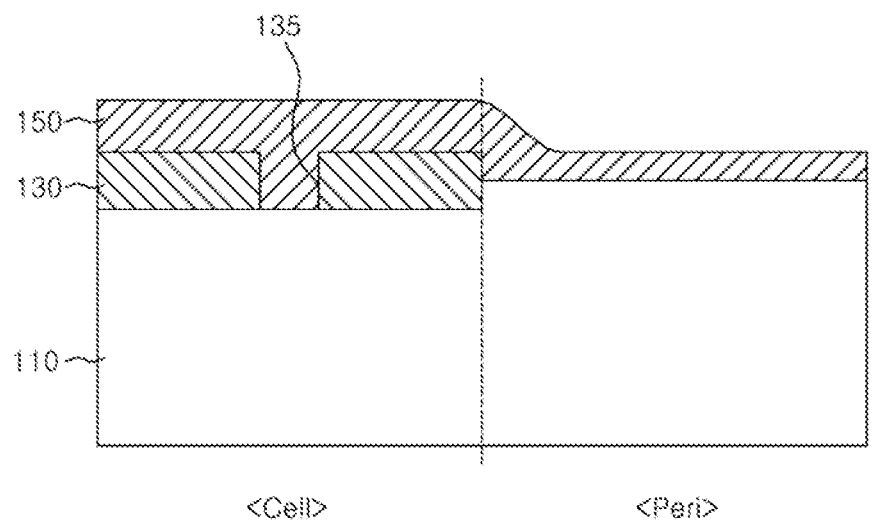

As illustrated in FIG. 5, a photoresist pattern (not shown) is formed on a predetermined region of the first semiconductor layer 140. The first semiconductor layer 140 and the sacrificial layer 130 are patterned in a form of the photoresist pattern to form a hole 135.

After the hole 135 is formed, a heat treatment is performed in a hydrogen atmosphere at a predetermined temperature. When the heat treatment is performed in the hydrogen atmosphere at the predetermined temperature, the first semiconductor layer (see 140 of FIG. 4) is flowed, and thus a second semiconductor layer 150 filling the hole is formed.

Figure 6:
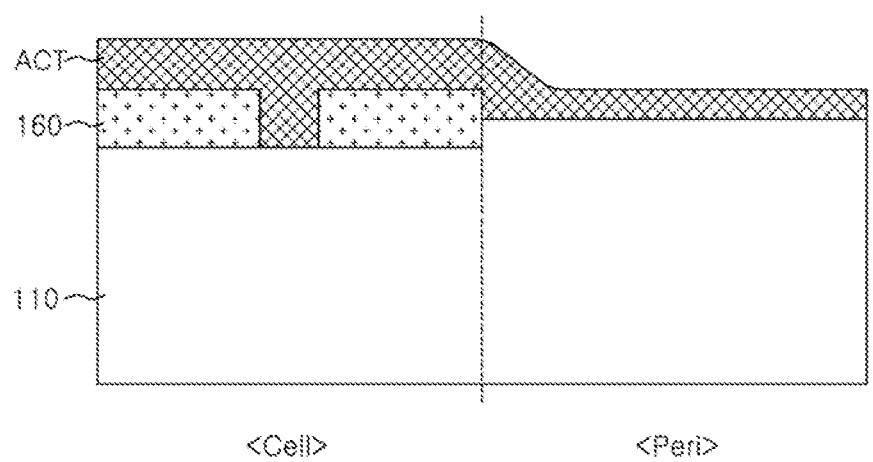

After the second semiconductor layer 150 is formed, as illustrated in FIG. 6, a hard mask (not shown) is formed, and the second semiconductor layer 150 and the sacrificial layer 130 are patterned to define an active region (ACT) in a direction substantially perpendicular to a gate line to be formed in a subsequent process.

When the active region (ACT) is defined, the sacrificial layer (see 130 of FIG. 5) is removed along an exposed surface thereof, and an insulating layer 160 is buried in a portion from which the sacrificial layer is removed to form an SOI structure. The insulating layer 160 may include an insulating material having good gap-fill characteristic and having a high etch rate to a wet etching solution such as spin on dielectric (SOD).

Although not shown, a word line is formed on the active region by performing a gate formation process, and impurities are implanted into the active region at both sides of the word line to form a source region and a drain region.

The source region may be a region electrically coupled to the semiconductor substrate 110, specifically, a common source region, and the drain region may be a region on the insulating layer 160.

In the embodiment, when the semiconductor device including the SOI substrate is fabricated, the insulating layer 120 may be formed in the peripheral area to prevent the sacrificial layer 130, that is, the SiGe layer from being grown in the peripheral area, and thus the SiGe layer may be smoothly grown only on a desired area (cell area).

In the embodiment, when the semiconductor device including the SOI substrate is fabricated, the silicon (Si) of a surface of the cell area is etched through a pre-cleaning process and a pre-baking process to reduce a height of the cell area. Therefore, a step difference between the cell area and the peripheral area may be reduced in a subsequent process.

In the embodiment, when the semiconductor device including the SOI substrate is fabricated, the sacrificial layer 130 is grown in the cell area of the semiconductor substrate 110 while removing the insulating layer 120 formed in the peripheral area without use of Cl gas as an etch gas typically used. Therefore, defects may be prevented from being caused in the growth of the Site layer.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method for fabricating a semiconductor device, the method comprising:
   forming a first insulating layer in a first area of a semiconductor substrate;
   lowering a height of the semiconductor substrate in a second area and a height of the first insulating layer in the first area;
   selectively forming a sacrificial layer in the second area using the first insulating layer as a growth prevention layer; and
   forming a first semiconductor layer on the semiconductor substrate including the sacrificial layer.

2. The method of claim 1, wherein the selective forming of the sacrificial layer includes forming the sacrificial layer in the second area while removing the first insulating layer from the first area by providing a deposition gas onto the semiconductor substrate.

3. The method of claim 2, wherein the deposition gas includes $GeH_4/SiH_4$ gas.

4. The method of claim 2, wherein the first insulating layer reacts with the deposition gas to be removed from the first area.

5. The method of claim 3, wherein the sacrificial layer includes a silicon germanium (SiGe) layer grown in an epitaxial method through reaction with the deposition gas.

6. The method of claim 1, wherein the lowering of the heights of the semiconductor substrate and the first insulating layer includes performing at least one of a cleaning process and a baking process.

7. The method of claim 1, wherein the first semiconductor layer includes a silicon (Si) layer.

8. The method of claim 1, further comprising, after the forming of the first semiconductor layer:
- forming a hole by patterning the first semiconductor layer and the sacrificial layer;
- forming a second semiconductor layer filling the hole by flowing the first semiconductor layer;
- defining an active region by patterning the second semiconductor layer and the sacrificial layer; and
- removing the sacrificial layer, and forming a second insulating layer in a portion from which the sacrificial layer is removed.

9. The method of claim 1, wherein the first area includes a peripheral area of the semiconductor substrate and the second area includes a cell area of the semiconductor substrate.

10. The method of claim 1, wherein in the lowering of the height of the semiconductor substrate, an upper surface of the semiconductor substrate in the second area is lower than an upper surface of the semiconductor substrate in the first area.

* * * * *